United States Patent
Liang

(10) Patent No.: US 10,658,600 B2
(45) Date of Patent: May 19, 2020

(54) METHOD OF FABRICATING FLEXIBLE SUBSTRATE HAVING LAMINATED MATERIAL MADE OF SILICON OXIDE AND AMORPHOUS SILICON

(71) Applicant: Wuhan China Star Optoelectronics Semiconductor Display Technology Co., Ltd., Wuhan, Hubei (CN)

(72) Inventor: Bo Liang, Hubei (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 209 days.

(21) Appl. No.: 15/579,423

(22) PCT Filed: Nov. 21, 2017

(86) PCT No.: PCT/CN2017/112132
§ 371 (c)(1),
(2) Date: Dec. 4, 2017

(87) PCT Pub. No.: WO2019/095406
PCT Pub. Date: May 23, 2019

(65) Prior Publication Data
US 2019/0229281 A1 Jul. 25, 2019

(51) Int. Cl.
*C23C 16/40* (2006.01)
*H01L 51/00* (2006.01)
(Continued)

(52) U.S. Cl.
CPC .......... *H01L 51/0097* (2013.01); *B32B 9/045* (2013.01); *H01L 51/50* (2013.01);
(Continued)

(58) Field of Classification Search
CPC ........ C23C 16/402; C23C 16/50; H05H 1/24; B32B 9/045; B32B 2250/03; B32B 2255/10; B32B 2255/20; B32B 2457/206
See application file for complete search history.

(56) References Cited

U.S. PATENT DOCUMENTS 9,472,650 B2 * 10/2016 Koo .................. H01L 29/66757
2010/0120263 A1 * 5/2010 Hsueh .................. H01L 21/324
438/795
(Continued)

FOREIGN PATENT DOCUMENTS

CN 103545463 A 1/2014
CN 104637438 A 5/2015
(Continued)

OTHER PUBLICATIONS

Zhang, J., et al., "Single-grain Si thin-film transistors on flexible polyimide substrate fabricated from doctor-blade coated liquid-Si". Applied Physics Letters 102, 243502 (2013), pp. 1-4.*
(Continued)

*Primary Examiner* — Bret P Chen
(74) *Attorney, Agent, or Firm* — Hemisphere Law, PLLC; Zhigang Ma

(57) ABSTRACT

A fabricating method of a flexible substrate is provided, including: step 1: fabricating a first flexible base; step 2: fabricating at least one layer of a laminated material made of silicon oxide and amorphous silicon on the first flexible base; step 3: performing a dehydrogenation treatment to the laminated material; and step 4: fabricating a second flexible base on the laminated material to obtain a flexible substrate. Compared with the prior art, by disposing two layers of flexible bases and a laminated material between the flexible bases, the stability of multiple bending can be improved; by performing a dehydrogenation treatment of the laminated
(Continued)

material, the defects of the flexible substrate in the back-end process can be reduced.

2 Claims, 1 Drawing Sheet

(51) Int. Cl.
*B32B 9/04* (2006.01)
*H01L 51/50* (2006.01)
*C23C 16/513* (2006.01)

(52) U.S. Cl.
CPC ....... *B32B 2250/03* (2013.01); *B32B 2250/40* (2013.01); *B32B 2255/10* (2013.01); *B32B 2255/20* (2013.01); *B32B 2307/732* (2013.01); *B32B 2457/206* (2013.01); *C23C 16/402* (2013.01); *C23C 16/513* (2013.01); *H01L 2251/5338* (2013.01)

(56) References Cited

U.S. PATENT DOCUMENTS

| | | | | |
|---|---|---|---|---|
| 2011/0318889 | A1* | 12/2011 | Chida | H01L 27/1225 438/158 |
| 2012/0132950 | A1* | 5/2012 | Yamamuro | H01L 51/529 257/99 |
| 2014/0037897 | A1* | 2/2014 | Wyner | A45C 3/001 428/138 |
| 2014/0209877 | A1 | 7/2014 | Lee et al. | |
| 2015/0123098 | A1* | 5/2015 | Kang | H01L 51/5253 257/40 |
| 2016/0075110 | A1* | 3/2016 | Kakuta | B32B 17/10 428/141 |
| 2017/0256631 | A1* | 9/2017 | Min | H01L 21/02532 |
| 2018/0331206 | A1* | 11/2018 | Min | H01L 21/02532 |

FOREIGN PATENT DOCUMENTS

| | | |
|---|---|---|
| CN | 105226186 A | 1/2016 |
| CN | 106784384 A | 5/2017 |
| CN | 107681060 A | 2/2018 |

OTHER PUBLICATIONS

Fang, Hui, et al., "Ultrathin, transferred layers of thermally grown silicon dioxide as biofluid barriers for biointegrated flexible electronic systems". PNAS, Oct. 18, 2016, vol. 113, No. 42, 11682-11687.*

Rajib, Arifuzzaman, et al., "Study of the Influence of Temperature on the Deposition of SiO2 Films from Reaction of Silicone Oil Vapor and Ozone Gas". Rajshahi University Journal of Science & Engineering, vol. 44: 1-8, 2016.*

Ma, Xiaochen, et al., "A Sputtered Silicon Oxide Electrolyte for High-Performance Thin-Film Transistors". Scientific Reports, 7: 809, Apr. 11, 2017, pp. 1-6.*

* cited by examiner

METHOD OF FABRICATING FLEXIBLE SUBSTRATE HAVING LAMINATED MATERIAL MADE OF SILICON OXIDE AND AMORPHOUS SILICON

RELATED APPLICATIONS

The present application is a National Phase of International Application Number PCT/CN2017/112132, filed Nov. 21, 2017, and claims the priority of China Application 201711132003.0, filed Nov. 15, 2017.

FIELD OF THE DISCLOSURE

The disclosure relates to a display panel manufacturing technology, in particular to a flexible substrate and a fabricating method thereof.

BACKGROUND

A flexible display is a display device based on a flexible base. Flexible display device has broad application prospects and good market potential due to its features such as rollability, wide viewing angle, and carriability. At present, the materials used for the flexible display base are ultra-thin glass, plastic film, metal foil, and the like.

Polyimide (PI) is a kind of polymer with imide repeating units, which has the advantages of wide application temperature, chemical resistance, high strength, and high insulation. PI has been widely used as a special engineering material in aviation, aerospace, microelectronics, and other fields. At present, PI as a flexible substrate material has been successfully applied to some flexible display electronics.

Flexible display substrate is not only a major difficulty but also a key technology of a flexible OLED display device. The stability of flexible display substrate in the back-end process is conducive to greatly improve the yield of the array, the bending property of the flexible display device mainly depends on the design of the flexible substrate, including the material of the flexible substrate and the structure of the flexible substrate, and how to ensure the stability of the back-end process is a problem to be solved.

SUMMARY

In order to overcome the deficiencies of the prior art, the disclosure provides a flexible substrate and a fabricating method thereof, which solves the problem of stress mismatch between the existing flexible substrate and the thin film transistor device layer and improves the stability of multiple bending of the flexible substrate.

The disclosure provides a flexible substrate, including two layers of flexible bases, and at least one layer of laminated material made of silicon oxide and amorphous silicon is disposed between the two layers of flexible bases.

Further, the material of the flexible base is polyimide.

Further, amorphous silicon is disposed on silicon oxide in the laminated material.

Further, the two layers of flexible bases have different thicknesses.

The disclosure also provides a fabricating method of a flexible substrate, including the steps of:

step 1: fabricating a first flexible base;

step 2: fabricating at least one layer of laminated material made of silicon oxide and amorphous silicon on the first flexible base;

step 3: performing a dehydrogenation treatment to the laminated material;

step 4: fabricating a second flexible base on the laminated material to obtain a flexible substrate.

Further, the dehydrogenation treatment is to heat the laminated material under a protective atmosphere.

Further, the heating temperature of the laminated material under the protective atmosphere is of 420-550° C. and the heating time is of 15-60 min.

Further, the first flexible base in step 1 and the second flexible base in step 4 are specifically fabricated by coating and curing.

Further, the laminated material in step 2 is fabricated by plasma enhanced chemical vapor deposition.

Further, a material of the first flexible base and the second flexible base is polyimide.

Compared with the prior art, by disposing two layers of flexible bases and disposing a laminated material between the flexible bases, the stability of multiple bending can be improved; by performing a dehydrogenation treatment of the laminated material after the laminated material is fabricated, the production of defects of the flexible substrate in the back-end process can be reduced.

DETAILED DESCRIPTION OF PREFERRED EMBODIMENTS

Figure 1:
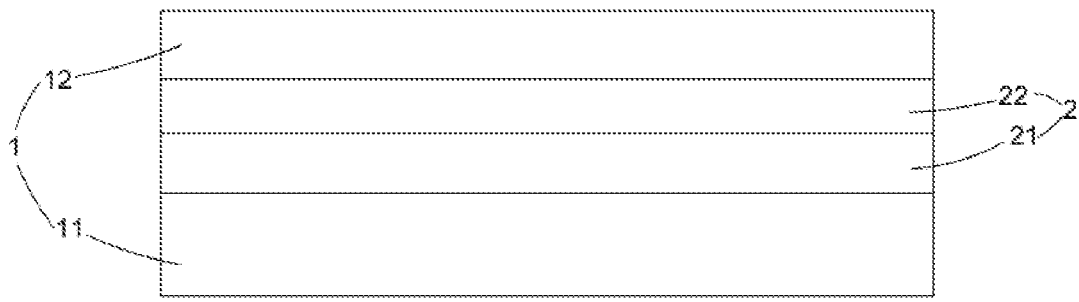
FIG. 1 is a schematic structural view of the flexible substrate of the disclosure.

In describing the disclosure, portions unrelated to the description will be omitted. The same reference numerals generally indicate the same elements throughout the specification. In addition, the size and thickness of each element shown in the drawings are arbitrarily shown for convenience of better understanding and description, but the embodiments of the disclosure are not limited thereto.

In the drawings, the thicknesses of layers, films, plates, regions, etc., may be exaggerated for clarity and for better understanding and ease of description. It will be understood that when an element such as a layer, film, region, or base is referred to as being "on another element," it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements.

Further, in the specification, the term "on" means positioning on or above or below the object portion, but does not essentially mean positioning on the upper side of the object portion based on a gravity direction.

The disclosure will be further described in detail below with reference to the accompanying drawings and embodiments.

As shown in FIG. 1, the disclosure discloses a flexible substrate including two layers of flexible bases 1, and at least one layer of laminated material 2 made of silicon oxide ($SiO_2$) 21 and amorphous silicon (a-Si) 22 is disposed between the two layers of flexible bases. Specifically, a first flexible base 11 is located in the lower end of the laminated material 2 of the two layers of base 1, and a second base 12 in the upper end of the laminated material 2, and the first flexible base 11 and the second flexible base 12 have different thicknesses, and amorphous silicon in the laminated material 2 is disposed on silicon oxide.

In the disclosure, the material of the flexible base 1 is polyimide, which is fabricated by coating and curing.

As an embodiment of the disclosure, the laminated material 2 is disposed with one layer, and the thickness of the first flexible base 11 is greater than the thickness of the second flexible base 12. The first flexible base 11 has a thickness of 4-15 μm, the second flexible base 12 has a thickness of 4-10 μm; silicon oxide has a thickness of 1000-6500 Å, and amorphous silicon has a thickness of 60-200 Å.

In the laminated material 2, the silicon oxide 21 and the amorphous silicon 22 may be fabricated separately or in the same process, specifically fabricated by plasma enhanced chemical vapor deposition (PECVD).

The double-layer structure adopted by the flexible substrate of the disclosure can improve the stability of multiple bending and avoid the problem of stress mismatch between the flexible substrate and the thin film transistor device layer.

The disclosure also discloses a fabricating method of a flexible substrate, including the following steps:

step 1: as shown in FIG. 1, fabricating a first flexible base 11; specifically, the first flexible base 11 is fabricated by using a polyimide material through the method of coating and curing of PI in an existing substrate, and the coating and curing can be performed on a base substrate. The thickness of the first flexible base 11 is of 4-15 um.

Figure 2:
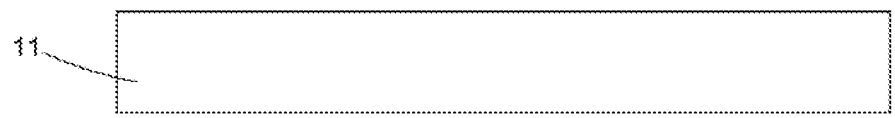
FIG. 2 is a schematic view of a first layer of flexible base according to the disclosure.
Figure 3:
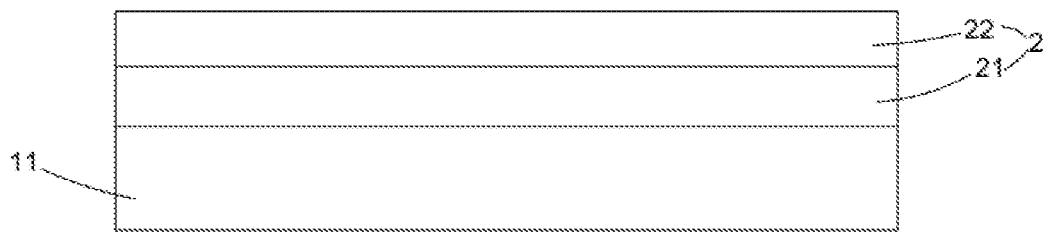
FIG. 3 is a schematic view of the disclosure for fabricating a laminated material.

Step 2: as shown in FIG. 2, fabricating at least one layer of laminated material 2 made of silicon oxide and amorphous silicon on a first flexible base 11; specifically, the laminated material 2 is fabricated by plasma enhanced chemical vapor deposition (PECVD). In the laminated material 2, the silicon oxide 21 and the amorphous silicon 22 may be fabricated separately or in the same process.

Step 3: performing a dehydrogenation treatment to the laminated material; the dehydrogenation treatment is to heat the laminated material under a protective atmosphere. The heating described herein is performed in conjunction with the first flexible base 11; specifically, the heating temperature of the laminated material 2 under the protective atmosphere is of 420-550° C. and the heating time is of 15-60 min; The heating may be performed in a baking machine or in an equipment for heating, which is not limited herein. Nitrogen gas can be used as the protective atmosphere, but the disclosure is not limited thereto. Other inert gases for protecting atmosphere such as helium, neon, argon, krypton, and xenon can also be used. The thickness of the silicon oxide is of 1000-6500 Å, while the thickness of the amorphous silicon is of 60-200 Å.

Step 4, as shown in FIG. 1, fabricating a second flexible base 12 on the laminated material 2 to obtain a flexible substrate. Specifically, the second flexible base 12 is fabricated by a polyimide material through the method of coating and curing of PI in an existing substrate. And the second flexible base 12 has a thickness of 4-10 μm.

When the second flexible base 12 is fabricated in step 4, the curing temperature should be less than the heating temperature during the dehydrogenation treatment, the heating temperature is specifically 20° C. and above.

As an embodiment of the fabricating method of the flexible substrate of the disclosure, the thickness of the first flexible base 11 located in the lower end of the laminated material 2 is different from the thickness of the second base 12 in the upper end of the laminated material 2, and amorphous silicon is disposed on silicon oxide in the laminated material. Specifically, the thickness of the first flexible base 11 is greater than the thickness of the second flexible base 12.

In the disclosure, the dehydrogenation treatment is performed after the laminated material is fabricated, which can avoid the problem of more defects between polyimide and amorphous silicon when the flexible base of the polyimide is fabricated on the laminated material.

When the disclosure is applied to fabricate a thin film transistor device layer, the thin film transistor device layer is fabricated on the second flexible base 12.

The disclosure also has a flexible display substrate using a double PI structure, the structure of the intermediate layer by using a $SiO_2$/a-Si lamination is ideal, and $SiO_2$ has the benefit of blocking water, oxygen, and heat, but its hydrophilicity is not as good as a-Si. However, the use of such a laminated structure results in more defects (air bubbles and foreign matter) in the second flexible base. After fabricating the laminated structure of $SiO_2$/a-Si by PECVD, the defects can be reduced by performing a dehydrogenation treatment once and then performing the coating and curing of the second flexible base.

While the present disclosure has been particularly shown and described with reference to exemplary embodiments thereof, it will be understood by those skilled in the art that various changes in form and details may be made therein without departing from the spirit and scope of the present disclosure as defined by the appended claims.

What is claimed is:

1. A fabricating method of a flexible substrate, comprising the following steps:
    step 1: fabricating a first flexible base;
    step 2: fabricating at least one layer of a laminated material made of silicon oxide and amorphous silicon on the first flexible base;
    step 3: performing a dehydrogenation treatment to heat the laminated material and the first flexible base; and
    step 4: fabricating a second flexible base on the laminated material to obtain a flexible substrate;
    wherein a thickness of the first flexible base is greater than a thickness of the second flexible base, and a material of the first flexible base and the second flexible base is polyimide;
    wherein the dehydrogenation treatment is performed under a protective atmosphere, a heating temperature under the protective atmosphere is of 420-550° C. and the heating time is of 15-60 min; and
    wherein the first flexible base in step 1 and the second flexible base in step 4 are specifically fabricated by coating and curing, a curing temperature is higher than 20° C. and lower than the heating temperature during the dehydrogenation treatment.

2. The fabricating method of the flexible substrate according to claim 1, wherein the laminated material in step 2 is fabricated by plasma enhanced chemical vapor deposition.

* * * * *